(12) United States Patent
Chen et al.

(10) Patent No.: US 12,505,821 B2
(45) Date of Patent: *Dec. 23, 2025

(54) INDOOR CABINETS HAVING REDUCED ACOUSTIC FOOTPRINTS

(71) Applicant: Quanta Computer Inc., Taoyuan (TW)

(72) Inventors: Yi-Chieh Chen, Taoyuan (TW); Yueh-Chang Wu, Taoyuan (TW); Te-Chuan Wang, Taoyuan (TW); Tzu-Hsuan Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 442 days.

This patent is subject to a terminal disclaimer.

(21) Appl. No.: 18/165,838

(22) Filed: Feb. 7, 2023

(65) Prior Publication Data

US 2024/0265903 A1    Aug. 8, 2024

(51) Int. Cl.
*G10K 11/168* (2006.01)
*H05K 7/20* (2006.01)

(52) U.S. Cl.
CPC ....... *G10K 11/168* (2013.01); *H05K 7/20736* (2013.01)

(58) Field of Classification Search
CPC ............ G10K 11/168; H05K 7/20136; H05K 7/20145; H05K 7/20572; H05K 7/20736;

(Continued)

(56) References Cited

U.S. PATENT DOCUMENTS 5,544,012 A   8/1996 Koike
6,104,003 A   8/2000 Jones
(Continued)

FOREIGN PATENT DOCUMENTS

CN   107072119 A   8/2017
CN   209824262 U * 12/2019
(Continued)

OTHER PUBLICATIONS

TW Office Action for Application No. 112115549, mailed Feb. 1, 2024, w/ First Office Action Summary, 8 pp.
(Continued)

*Primary Examiner* — Andrew Roersma
(74) *Attorney, Agent, or Firm* — NIXON PEABODY LLP

(57) ABSTRACT

An example compute cabinet assembly includes an equipment room, an air inlet channel coupled to the equipment room, and a cabinet fan module coupled to the equipment room. The compute cabinet assembly further includes first and second air outlet channels. The first air outlet channel extends along a side of the equipment room towards an outlet of the first air outlet channel. The second air outlet channel extends along another side of the equipment room towards an outlet of the second air outlet channel. The compute cabinet assembly also includes electric fans positioned in the cabinet fan module. The electric fans are configured to create airflow originating at an inlet of the air inlet channel, extending through the equipment room and cabinet fan module, and exiting the compute cabinet assembly at the outlets of the first and second air outlet channels.

15 Claims, 5 Drawing Sheets

(58) Field of Classification Search
CPC .. H05K 5/0213; H05K 5/0215; H05K 5/0216; H05K 5/03
See application file for complete search history.

(56) References Cited

U.S. PATENT DOCUMENTS

| | | | |
|---|---|---|---|
| 6,643,130 | B1 | 11/2003 | DeMarchis et al. |
| 6,877,551 | B2 | 4/2005 | Stoller |
| 8,248,793 | B2 | 8/2012 | Bash et al. |
| 8,254,122 | B2 | 8/2012 | Chang |
| 8,292,705 | B2 | 10/2012 | Matsuzawa et al. |
| 8,606,427 | B2 | 12/2013 | Chan et al. |
| 9,504,182 | B2 * | 11/2016 | Olsson ............... H01G 2/08 |
| 10,306,809 | B1 | 5/2019 | Totani |
| 11,013,151 | B1 * | 5/2021 | Chen ............... H05K 7/20736 |
| 11,847,095 | B1 | 12/2023 | Bassov |
| 12,079,062 | B2 | 9/2024 | Li |
| 12,289,858 | B2 | 4/2025 | Chen et al. |
| 2002/0100579 | A1 * | 8/2002 | Heikkila ........... H05K 7/20736 165/104.34 |
| 2004/0182799 | A1 | 9/2004 | Tachibana |
| 2006/0176664 | A1 | 8/2006 | Casebolt |
| 2007/0110255 | A1 | 5/2007 | Barath et al. |
| 2007/0218826 | A1 * | 9/2007 | Walsh ............... H05K 7/20572 454/906 |
| 2007/0230114 | A1 * | 10/2007 | Bartell ............... H05K 7/20736 361/679.49 |
| 2008/0109670 | A1 | 5/2008 | Johansson et al. |
| 2009/0255653 | A1 | 10/2009 | Mills et al. |
| 2010/0077240 | A1 | 3/2010 | Daga et al. |
| 2010/0317278 | A1 | 12/2010 | Novick |
| 2011/0029797 | A1 | 2/2011 | Vaden |
| 2011/0123036 | A1 * | 5/2011 | Barath ............. G10K 11/17853 454/184 |
| 2011/0141838 | A1 | 6/2011 | Kishibe |
| 2011/0145609 | A1 | 6/2011 | Berard et al. |
| 2011/0175504 | A1 * | 7/2011 | Cook ............... H05K 7/20572 49/70 |
| 2015/0280982 | A1 | 10/2015 | Taniuchi |
| 2015/0373872 | A1 | 12/2015 | Khandelwal et al. |
| 2016/0037685 | A1 | 2/2016 | Ross |
| 2016/0105994 | A1 | 4/2016 | Hwang |
| 2016/0224082 | A1 | 8/2016 | Ohsawa et al. |
| 2016/0242323 | A1 | 8/2016 | Chen et al. |
| 2016/0334861 | A1 | 11/2016 | Dang et al. |
| 2018/0067539 | A1 | 3/2018 | Samson et al. |
| 2018/0225066 | A1 | 8/2018 | Alavoine et al. |
| 2019/0129777 | A1 | 5/2019 | Rangarajan |
| 2019/0246524 | A1 * | 8/2019 | Totani ............... H05K 7/20754 |
| 2019/0254198 | A1 | 8/2019 | Magallanes et al. |
| 2020/0192734 | A1 | 6/2020 | Kao |
| 2020/0257627 | A1 | 8/2020 | Chamarty et al. |
| 2020/0264005 | A1 | 8/2020 | Heo et al. |
| 2020/0316581 | A1 | 10/2020 | Kaneko et al. |
| 2022/0171551 | A1 | 6/2022 | Adsure et al. |
| 2022/0206557 | A1 | 6/2022 | Karthikeyan et al. |
| 2022/0354022 | A1 * | 11/2022 | Chen ............... H05K 7/20818 |
| 2023/0025554 | A1 | 1/2023 | Chen et al. |
| 2023/0036737 | A1 | 2/2023 | Carbon-Ogden et al. |
| 2023/0125240 | A1 | 4/2023 | Wang et al. |
| 2023/0307030 | A1 | 9/2023 | Lu et al. |
| 2024/0268057 | A1 * | 8/2024 | Chen ............... H05K 7/20136 |
| 2024/0268059 | A1 | 8/2024 | Chen et al. |
| 2025/0003630 | A1 * | 1/2025 | Higgins ............... F24F 13/24 |

FOREIGN PATENT DOCUMENTS

| | | | |
|---|---|---|---|
| CN | 111629552 | A | 9/2020 |
| CN | 216792811 | U | 6/2022 |
| CN | 115666083 | A | 1/2023 |
| EP | 2754967 | A1 | 7/2014 |
| FR | 2831019 | A1 * | 4/2003 ......... H05K 7/20736 |
| JP | 2000294965 | A | 10/2000 |
| TW | 201205252 | A | 2/2012 |
| TW | I549600 | B | 9/2016 |
| TW | 201732618 | A | 9/2017 |
| TW | 202129465 | A | 8/2021 |
| TW | 202223883 | A | 6/2022 |
| WO | 2012058951 | A1 | 5/2012 |

OTHER PUBLICATIONS

TW Search Report for Application No. 112115549, mailed Feb. 1, 2024, w/ First Office Action, 1p.
Koike, Cooling Structure of Computer, Apr. 19, 2002, JP2002118387 (Year: 2002).
Sonoda, Electronic Apparatus Containing Rack and Its Cooling Method, Sep. 27, 2007, JP2007250713 (Year: 2007).
Klotz et al., Computer Cupboard and Arrangement of a Computer Cupboard, Dec. 19, 2002, WO02101528 (Year: 2002).
Notice of Allowance in U.S. Appl. No. 18/165,849 dated Mar. 3, 2025.
TW Office Action for Application No. 112115549 mailed Jul. 2, 2024, w/ Second Office Action Summary, 8 pp.
TW Search Report for Application No. 112115549 mailed Jul. 2, 2024, w/ Second Office Action, 1 p.

* cited by examiner

INDOOR CABINETS HAVING REDUCED ACOUSTIC FOOTPRINTS

TECHNICAL FIELD

The present disclosure relates generally to housing mechanisms for expansion components of computing devices. More particularly, aspects of this disclosure relate to cabinet assemblies configured to provide cooling capacity and noise reduction for the devices therein. For instance, in some approaches compute cabinet assemblies are configured to provide cooling capacity to compute devices implemented therein, while also reducing the noise profile of the assembly as a whole. It should be noted that although various approaches herein are described in the context compute cabinet assemblies, this is in no way intended to limit the invention. For instance, cabinet assemblies may be configured to implement audio components therein in some approaches.

BACKGROUND

Computer systems (e.g., desktop computers, blade servers, rack-mount servers, etc.) are employed in large numbers in various applications. High demand applications, such as network based systems, data centers, or high density finite element simulations that are able to push hardware of computing systems, require servers with specialized capabilities. Accordingly, modern servers are typically designed to allow flexibility in terms of capabilities and components.

Accordingly, compute architectures have changed over time. For instance, as computing throughputs increase, edge computing has been implemented in an attempt to reduce latency associated with accessing data over networks. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at a certain performance level. Sacrifices are often made in other areas in an effort to meet these performance capabilities, and as a result, a significant amount of noise is produced as a byproduct. This noise is caused by components like cooling fans operating at incredibly high revolutions per minute (RPMs), and baffling is minimized to increase airflow which further exacerbates the situation. While effective in terms of performance, it is not practical that these conventional servers be implemented in environments having any noise sensitivity, e.g., such as the majority of edge server applications.

Thus, there is a need for a configuration that is able to achieve significant heat dissipation while also minimizing the amount of noise produced as a result. Moreover, these heat and noise reductions must be made despite processing heavy I/O loads received from various users, applications, etc.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example compute cabinet assembly for providing cooling capacity and noise reduction is disclosed. The compute cabinet assembly includes an equipment room configured to implement electrical components therein, an air inlet channel coupled to a first side of the equipment room, and a cabinet fan module coupled to a second side of the equipment room opposite the first side. The compute cabinet assembly further includes a first air outlet channel and a second air outlet channel, both channels being coupled to the cabinet fan module. The first air outlet channel extends along a third side of the equipment room towards an outlet of the first air outlet channel. The second air outlet channel extends along a fourth side of the equipment room towards an outlet of the second air outlet channel. The compute cabinet assembly also includes electric fans positioned in the cabinet fan module. The electric fans are configured to create airflow originating at an inlet of the air inlet channel, extending through the equipment room and cabinet fan module, and exiting the compute cabinet assembly at the outlets of the first and second air outlet channels.

A further implementation of the example compute cabinet assembly includes inlets of the first and second air outlet channels being coupled to respective outlets of the cabinet fan module. Moreover, the first and second air outlet channels are configured to direct airflow down the respective third and fourth sides of the equipment room and away from the cabinet fan module. In another implementation, the third and fourth sides of the equipment room are on opposite sides of the equipment room. In another implementation, the compute cabinet assembly includes noise absorbing barriers, and noise isolation barriers.

In some implementations, each of the noise absorbing barriers include a plate, a noise absorbing layer coupled to the plate, and a noise isolation layer. In another implementation, an air layer separates the noise absorbing layer from the noise isolation layer. In still other implementations, the plate is a perforated plate having a plurality of holes extending therethrough. In some implementations, the noise absorbing barriers are applied to surfaces of the air inlet channel. In still other implementations, the noise absorbing barriers are applied to surfaces of the first and second air outlet channels. Moreover, in various implementations, the noise absorbing layers include foam, rockwool, or glasswool, while the noise isolation layers include rubber.

In some implementations, each of the noise isolation barriers include a noise absorbing layer, and a noise isolation layer. Some implementations include the noise absorbing layer coupled to the noise isolation layer. Moreover, the noise absorbing and noise isolation layers are sandwiched between outer walls of the respective noise absorbing barrier. In other implementations, the noise absorbing layers include foam, rockwool, or glasswool, while the noise isolation layers include rubber. In still other implementations, the noise absorbing barriers and the noise isolation barriers are applied to surfaces of the equipment room. In additional implementations, the noise absorbing barriers and the noise isolation barriers are applied to surfaces of the cabinet fan module.

In some implementations, the electric fans are oriented in a rectangular configuration in the cabinet fan module. In other implementations, the equipment room is configured to implement a plurality of edge servers or high performance computing (HPC) servers therein.

An example method for providing cooling capacity and noise reduction to a compute cabinet assembly is also disclosed. The method includes causing one or more electric fans in a cabinet fan module coupled to a first side of an equipment room in the compute cabinet assembly to create an airflow path. The airflow path originates at an inlet of an air inlet channel coupled to a second side of the equipment room opposite the first side, and extends through the equipment room and the cabinet fan module. The airflow path exits the compute cabinet assembly at first and second outlets of first and second respective air outlet channels. The first and second air outlet channels are coupled to the cabinet fan module and extend along third and fourth respective sides of the equipment room.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
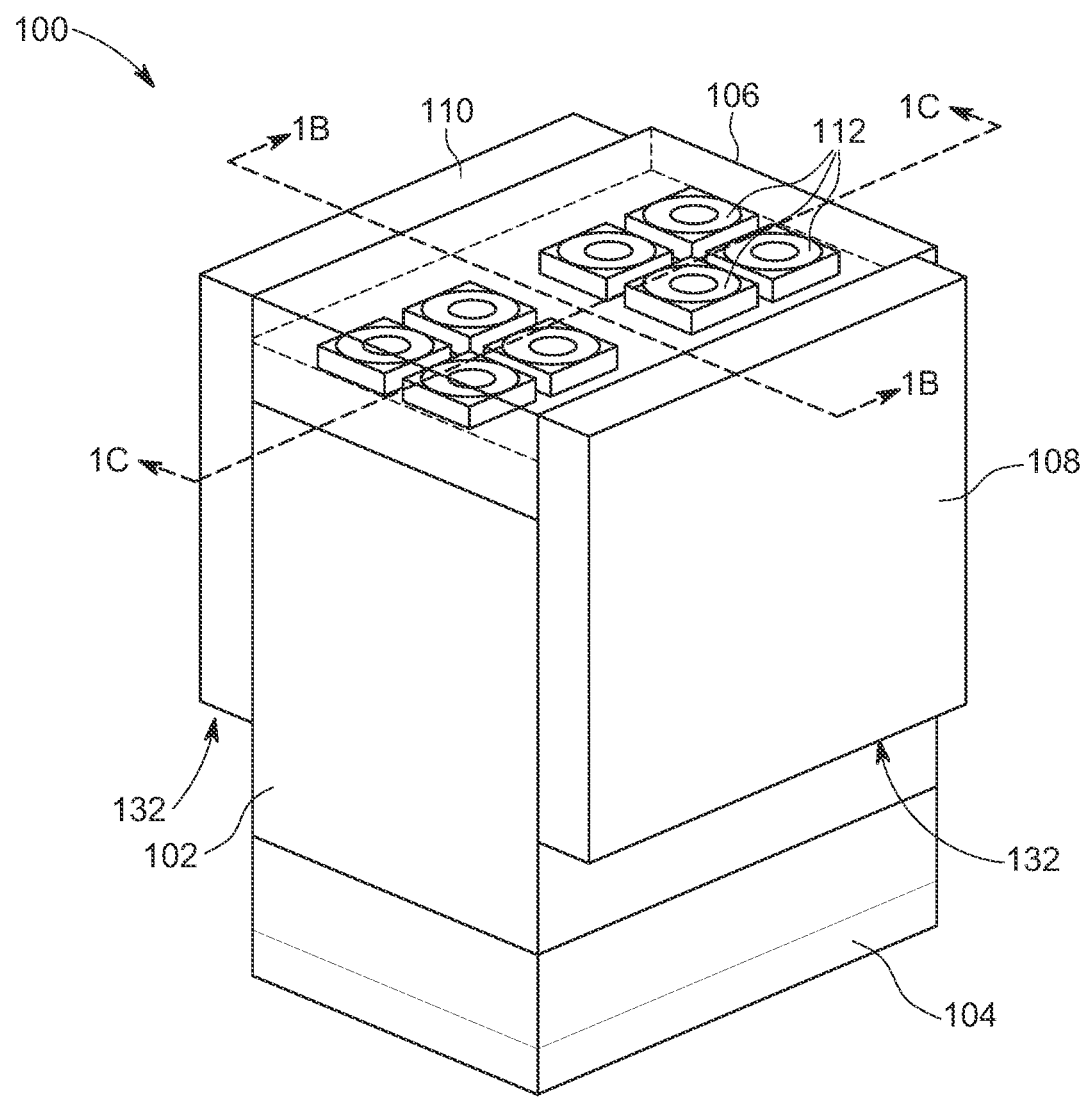
FIG. 1A is a perspective view of a compute cabinet assembly, according to certain aspects of the present disclosure.

The present disclosure is directed toward a compute cabinet assembly for providing cooling capacity and noise reduction is disclosed. The compute cabinet assembly includes an equipment room configured to implement electrical components therein, an air inlet channel coupled to a first side of the equipment room, and a cabinet fan module coupled to a second side of the equipment room opposite the first side. The compute cabinet assembly further includes a first air outlet channel and a second air outlet channel, both channels being coupled to the cabinet fan module. The first air outlet channel extends along a third side of the equipment room towards an outlet of the first air outlet channel. The second air outlet channel extends along a fourth side of the equipment room towards an outlet of the second air outlet channel. The compute cabinet assembly also includes electric fans positioned in the cabinet fan module. The electric fans are configured to create airflow originating at an inlet of the air inlet channel, extending through the equipment room and cabinet fan module, and exiting the compute cabinet assembly at the outlets of the first and second air outlet channels. In some implementations, the electric fans may be controlled by a processor or other type of computing device (e.g., a controller). Accordingly, the electric fans may be turned on and off by a processor determining to supply the electric fans with a supply voltage. In other implementations, the electric fans may receive instructions from a processor, and these instructions may be implemented in the electric fan by a processor (e.g., microcontroller) included therein that controls a motor of the electric fan to turn the unit as a whole on or off.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical", "horizontal", "parallel", and "perpendicular" are intended to additionally include "within 3-5% of" a vertical, horizontal, parallel, or perpendicular orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

As previously mentioned, compute architectures have changed over time. For instance, as computing throughputs increase, edge computing has been implemented in an attempt to reduce latency. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at peak performance, almost disregarding the amount of noise that is produced as a result. Thus, cooling fans are typically run at incredibly high revolutions per minute (RPMs) and baffling is minimized to increase airflow. While effective in terms of performance, these servers simply cannot be implemented in environments having any noise sensitivity. It follows that conventional servers are unsuited for implementation in a variety of settings, including those associated with edge computing.

In sharp contrast to these conventional shortcomings, various ones of the embodiments included herein are able to reduce noise without inhibiting performance. In other words, the approaches herein are able to reduce the noise profile of compute cabinet assemblies like edge servers such that they may be place in a wider range of locations having greater noise sensitivities than typical server warehouses. However, this noise reduction does not result in a corresponding reduction in performance typically experienced by conventional implementations. In fact, Inventors have verified with testing, that some of the approaches described herein are able to support over 20 kW of heat dissipation combined with over 25 dBA of noise removal at the same time. Again, this has been conventionally unachievable.

Figure 1C:
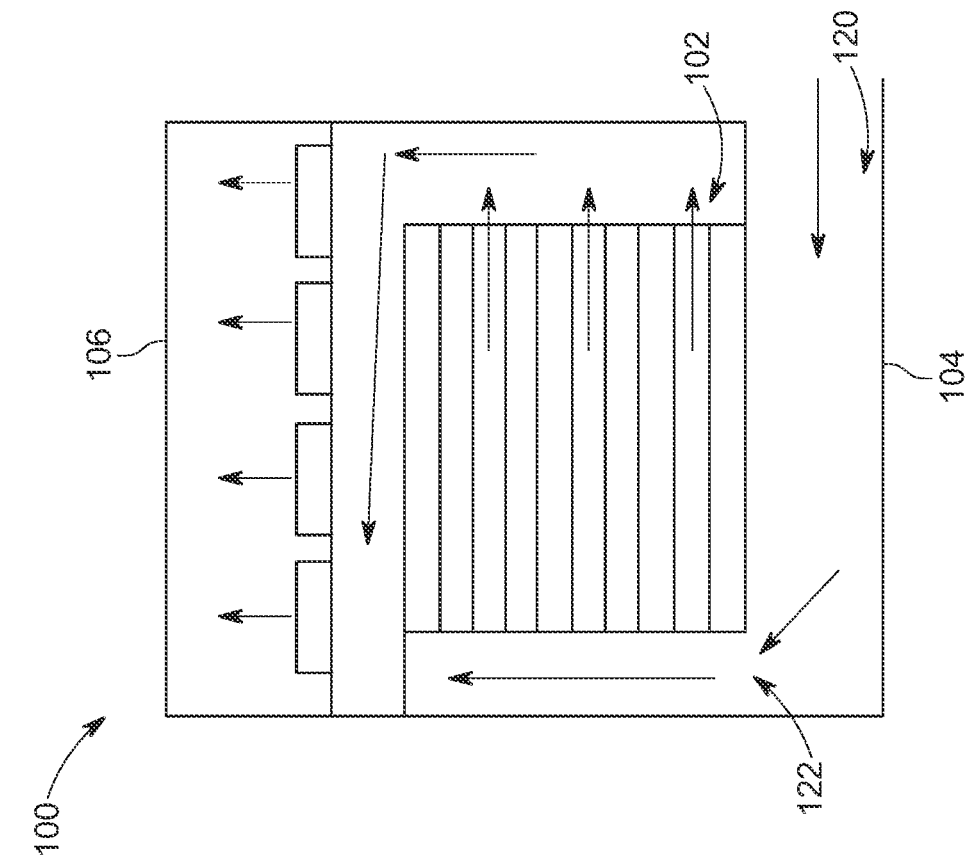
FIG. 1C is a cross-sectional side view of the compute cabinet assembly of FIG. 1A, according to certain aspects of the present disclosure.
Figure 1B:
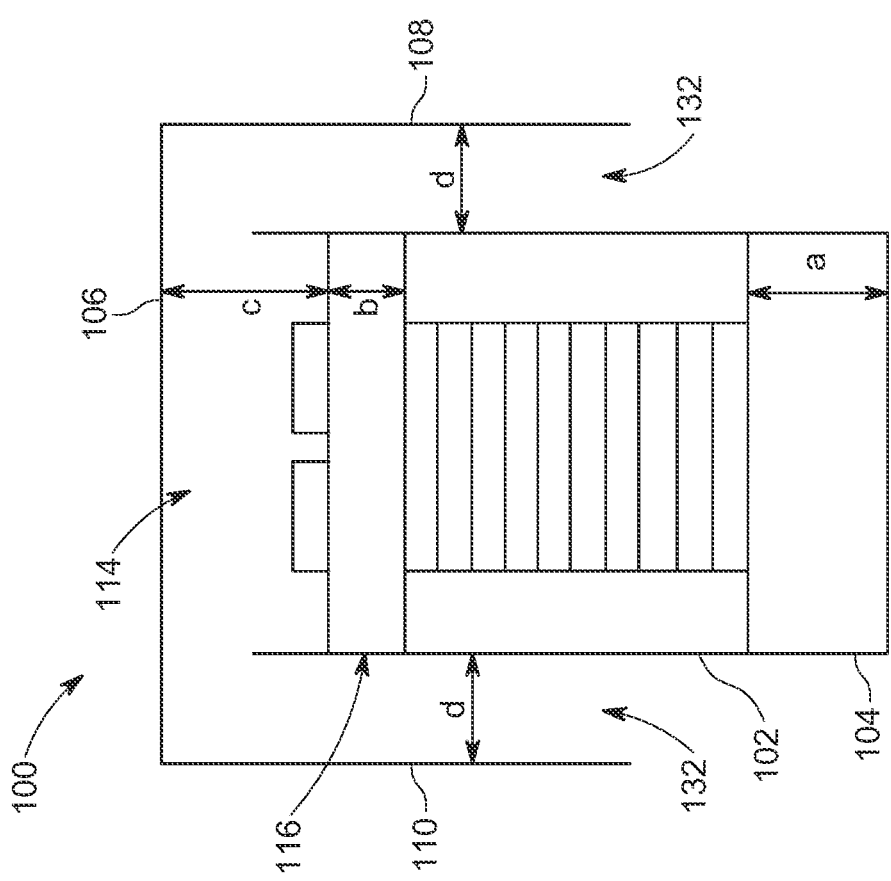
FIG. 1B is a cross-sectional view of the compute cabinet assembly of FIG. 1A, according to certain aspects of the present disclosure.

For instance, FIGS. 1A-1C, a compute cabinet assembly 100 that is capable of providing cooling capacity and noise reduction is illustrated in accordance with one embodiment. As an option, the present compute cabinet assembly 100 may be implemented in conjunction with features from any other embodiment listed herein, such as those described with reference to the other FIGS. However, such compute cabinet assembly 100 and others presented herein may be used in various applications and/or in permutations which may or may not be specifically described in the illustrative embodiments listed herein. Further, the compute cabinet assembly 100 presented herein may be used in any desired environment. Thus FIGS. 1A-1C (and the other FIGS.) may be deemed to include any possible permutation.

As shown, the compute cabinet assembly 100 includes an equipment room 102 configured to implement electrical components therein. The equipment room 102 may implement a variety of different electrical components and/or arrangements thereof depending on the implementation. For instance, the equipment room 102 may implement one or more servers in any desired configuration.

According to an example, the compute cabinet assembly 100 serves as an edge computing node. The equipment room 102 may thereby be configured to implement a plurality of edge servers therein, even at a user's location. This proximity to a data source allows for the compute cabinet assembly 100 and components therein to provide content caching, service delivery, persistent data storage, etc. As a result, at least some of the implementations included herein are able to achieve faster insights, improved response times, better bandwidth availability, etc., e.g., as will be described in further detail below.

An air inlet channel 104 is also shown as being coupled to a first side of the equipment room 102. Specifically, the air inlet channel 104 is depicted in the present embodiment as being directly coupled to a bottom surface of the equipment room 102, while the compute cabinet assembly 100 is positioned in an intended orientation. The compute cabinet assembly 100 also includes a cabinet fan module 106 coupled to a second side of the equipment room 102. Specifically, the cabinet fan module 106 is illustrated as being coupled directly to a top of the assembly 100. It follows that the air inlet channel 104 and cabinet fan module 106 are positioned on opposite sides of the compute cabinet assembly 100 in some implementations.

First and second air outlet channels 108, 110 are also illustrated as being positioned on opposite sides of the compute cabinet assembly 100. These air outlet channels 108, 110 are also positioned such that at least a portion of the cabinet fan module 106 is coupled thereto. For instance, air outlets of the cabinet fan module 106 may connect directly to respective inlets of the air outlet channels 108, 110. The first and second air outlet channels 108, 110 are thereby preferably configured to direct airflow down the respective sides of the equipment room 102 and away from the cabinet fan module 106, e.g., as shown.

However, the channels 108, 110 may be configured differently depending on the implementation. For instance, the air outlet channels 108, 110 may be positioned on adjacent sides (surfaces) of the compute cabinet assembly 100. In other implementations, the assembly 100 may only include one air outlet channel (e.g., see FIG. 3 below), include three air outlet channels, four air outlet channels, five air outlet channels, etc.

The air inlet channel 104, cabinet fan module 106, and air outlet channels 108, 110 preferably work together (in combination) to allow air to enter the assembly 100. As a result, operating temperatures of the various components inside the assembly 100 may be cooled such that performance efficiency is improved. Moreover, this reduction in temperature does not involve the high noise levels that have plagued conventional implementations. Thus, the compute cabinet assembly 100 may be implemented in a variety of different operating settings without causing undesirable side effects, e.g., as will be described in further detail below.

Looking specifically to FIG. 1C, the air inlet channel 104 is shown as having an inlet 120 that opens to the surrounding environment. The air inlet channel 104 thereby provides a pathway by which ambient air can enter the assembly 100 and travel therethrough, e.g., as will be described in further detail below. It follows that the air inlet channel 104 is preferably designed to allow for a desired amount (e.g., volume) of air to enter an interior of the assembly 100. This desired amount of air may vary depending on the number of components included in the assembly 100, the intended use of the assembly 100, a size of the assembly 100, the interior configuration(s) of the assembly 100, etc.

It follows that the dimensions of the various portions of the compute cabinet assembly 100 may vary depending on the implementation. For instance, FIG. 1B indicates a number of specific dimensions that may be adjusted, e.g., to produce the desired amount of airflow through the assembly 100. These dimensions may be "adjusted" in the sense that they can be set during manufacture of the physical assembly 100 and its various portions. As shown, the width "d" of the air outlet channels 108, 110 may be adjusted to control an amount of air that leaves the assembly 100. According to an exemplary range, the width "d" of either air outlet channel 108, 110 may be between about 8.89 centimeters (cm) and about 26.67 cm, but could be higher or lower as desired. Moreover, the air outlet channels 108, 110 may have the same, similar, or different dimensions depending on the approach. Furthermore, the height "a" of the air inlet channel 104 may be between about 13.34 cm and about 31.12 cm, but could be higher or lower depending on the desired implementation.

The cabinet fan module 106 is shown as being divided into a first section 114 and a second section 116. The first section 114 includes the plurality of electric fans 112, while the second section 116 is adjacent thereto. The second section 116 allows for air to fully exit the equipment room 102 and be drawn in by each of the electric fans 112. It follows that the dimensions of the first and second sections 114, 116 impacts airflow through the whole assembly 100. For instance, the height "c" of the first section 114 of the cabinet fan module 106 may also be adjusted. By adjusting the height "c" of the first section 114, the electric fans 112 may be able to create more or less air pressure, thereby leading to larger or smaller airflows, respectively. According to another exemplary range, the height "c" of the first section 114 of the cabinet fan module 106 may be between about 4.45 cm and about 17.78 cm. Moreover, the height "b" of the second section 116 may be adjusted to allow for more or less air to be provided to the various electric fans 112. According to an exemplary range, the height "b" of the second section 116 of the cabinet fan module 106 may be between about 4.45 cm and about 17.78 cm.

While certain dimensions have been indicated in FIG. 1B, these are in no way intended to be limiting. Any other dimensions or aspects of the compute cabinet assembly 100 may be adjusted as desired. It should also be noted that the relative orientation of the dimensions described with respect to FIG. 1B are in no way intended to be limiting. Thus, while dimension "a" is described above as a height, this is in no way intended to limit the invention. For example, if the air inlet channel were to be implemented in a different orientation, position, environment, etc., the dimension "a" may be referenced as a width, thickness, length, etc., or any other equivalent measurement.

The inlet 120 of the air inlet channel 104 may be free of any obstructions in some approaches. In other words, the inlet 120 of the air inlet channel 104 may be configured to permit a maximum amount of air into the assembly 100. In other approaches however, the inlet 120 of the air inlet channel 104 may implement an air filter configured to remove contaminates from the ambient air that is drawn into the assembly 100 and/or some other type of component that at least partially blocks airflow from entering. An outlet 122 of the air inlet channel 104 may also be configured differently depending on the approach.

The outlet 122 of the air inlet channel 104 opens directly to the equipment room 102. Ambient air taken in by the air inlet channel 104 is thereby allowed to enter and circulate throughout the equipment room 102. As noted above, this allows for the various electrical components included in the equipment room 102 to operate without overheating.

For instance, looking again specifically to FIG. 1C, the arrowed lines demonstrate that ambient air is drawn into the air inlet channel 104 before entering the equipment room 102. There, the ambient air flows through each of the electrical components and/or physical bays that are configured to implement (e.g., hold) the various electrical components of the equipment room 102. Heat generated by the electrical components in the equipment room 102 may thereby be transferred to the cooler ambient air passing through, before being carried into the cabinet fan module 106. There, heat generated by the electric fans 112 and/or any other electrical components in the cabinet fan module 106 may also be absorbed before eventually exiting through outlets of the cabinet fan module 106, each outlet being connected (e.g., aligned and functionally coupled to) inlets of the air outlet channels 108, 110. The heat from the equipment room 102 and/or cabinet fan module 106 is removed from the assembly 100 at outlets of the air outlet channels 108, 110. The inlets and the outlets of the air outlet channels 108, 110 are thereby configure the airflow path such that airflow is directed from the first and second air outlet channels 108, 110 to the respective sides of the equipment room 102 and away from the cabinet fan module 106. It follows that the assembly 100 may preferably be implemented in environments having a lower ambient temperature than an average operating temperature in the equipment room 102. In some implementations, the assembly 100 may even be configured to condition (e.g., cool, dehumidify, etc.) air before it is used to cool the electrical components therein.

Electric fans 112 positioned in the cabinet fan module 106 are used to at least partially generate the airflow that passes through the compute cabinet assembly 100. In other words, the electric fans are preferably configured to create airflow originating at the inlet 120 of the air inlet channel 104, extending through the equipment room 102 and cabinet fan module 106, finally exiting the compute cabinet assembly 100 at the outlets 132 of the first and second air outlet channels 108, 110. As noted above, in some implementations the electric fans 112 are controlled by a processor or other type of computing device (e.g., a controller) to create this airflow. Accordingly, the electric fans 112 may be turned on to create the airflow, or off to stop the airflow by a processor determining to supply the electric fans 112 with a supply voltage. In other implementations, the electric fans 112 may receive instructions from a processor, and these instructions may be implemented in the electric fan 112 by a processor (e.g., microcontroller) included therein that controls a motor of the electric fan 112 to turn the unit as a whole on to create the airflow, or off to stop the airflow.

For instance, the positive and negative pressures formed by the electric fans 112 while operating (e.g., rotating) create a bias that draws ambient air in through the air inlet channel 104, pushes the ambient air through the equipment room 102, and out through the air outlet channels 108, 110. The orientation and/or amplitude of the air pressures formed by the electric fans 112 may be selectively adjusted by changing the dimensions (e.g., pitch, length, thickness, etc.) of the physical blades in the electric fans 112, the operating speed of the electric fan(s) 112, the orientation of the electric fans 112, the direction in which blades of the electric fans 112 rotate, etc. It follows that the specific amount of airflow that is desired for a given situation may be achieved.

According to a specific example, which is in no way intended to limit the invention, the compute cabinet assembly 100 functions as an edge server, HPC server, or any other type of server which would be apparent to one skilled in the art after reading the present description. Over time, this server may be faced with different workloads and therefore will be throttled between different throughput levels, causing the electrical components therein to experience a range of operating settings. The operating speed of the electric fans 112 may thereby be ramped up and down to achieve a sufficient airflow for the electrical components in the compute cabinet assembly 100 to be cooled properly while also reducing power consumption and operating noise. The electric fans 112 may thereby communicate with one or more sensors positioned throughout the compute cabinet assembly 100. For instance, temperature sensors may be positioned throughout the equipment room 102 and relay temperature-based information to a processor that controls the operating settings of the various electric fans 112. Similarly, temperature sensors positioned in the air inlet channel 104 may identify the temperature of the incoming ambient air which indicates the cooling capacity of the ambient air. The operating settings of the electric fans 112 may thereby be adjusted based on how effective the ambient air is at absorbing heat from the equipment room 102, e.g., as would be appreciated by one skilled in the art after reading the present description.

It follows that depending on the configuration and/or operating settings of the electric fans 112, they may produce a significant amount of noise in some situations. As noted above, conventional implementations have been unable to reduce noise levels produced without significantly increasing operating temperatures. In sharp contrast, various ones of the implementations included herein are able to maintain high amounts of thermal capacity while also significantly reducing the amount of noise that is produced by the assembly 100.

These improvements are achieved at least in part by the relative positions of the various portions of the compute cabinet assembly 100. For instance, by positioning the equipment room 102 towards a center of the assembly 100 with the air inlet channel 104, cabinet fan module 106, and air outlet channels 108, 110 generally surrounding it, the noise produced by the electrical components implemented in the equipment room 102 (e.g., physical servers) and the electric fans 112 are confined within the assembly 100 and absorbed before entering the surrounding environment. Accordingly, it is desirable that the air outlet channels 108, 110 are partially coupled to the cabinet fan module 106 and extend along the sides of the equipment room towards the outlets 132.

With continued reference to FIGS. 1A-1C, the acoustic profile of the compute cabinet assembly 100 may further be improved by implementing one or more noise absorbing barriers and/or noise isolation barriers. A noise absorbing barrier is preferably configured to at least partially absorb sound (i.e., soundwaves) produced by components in the assembly 100. This may be accomplished by converting some of the energy in the audible noise to heat that is absorbed. Accordingly, it may be advantageous to place noise absorbing barriers near entrances and exits of the compute cabinet assembly 100 to prevent noise from exiting. For example, noise absorbing barriers may be applied to one or more interior surfaces of the air inlet channel 104 and/or the air outlet channels 108, 110.

On the other hand, a noise isolation barrier (e.g., noise insulation) may be used to restrict sound from travelling between separate spaces through shared surfaces, e.g., such as walls, ceilings, floors, etc. Accordingly, it may be advantageous to place noise isolation barriers near noise sources in the compute cabinet assembly 100 to prevent noise from escaping from these specific portions or compartments. For example, noise isolation barriers may be applied to one or more interior surfaces of the equipment room 102 and/or the cabinet fan channels 108, 110.

Figure 2A:
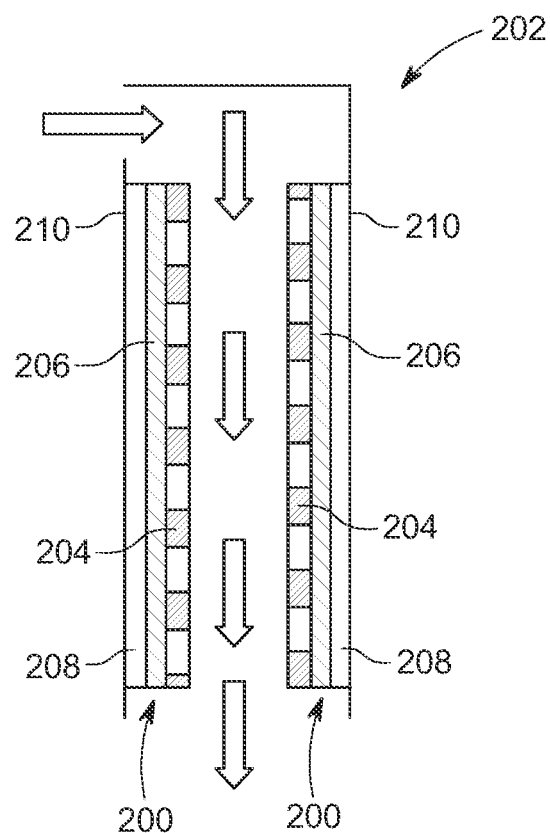
FIG. 2A is a cross-sectional view of a channel having air absorbing barriers applied to interior surfaces thereof, according to certain aspects of the present disclosure.
Figure 2B:
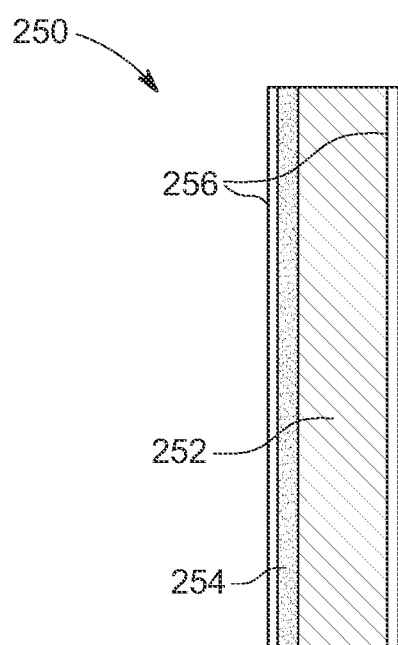
FIG. 2B is a cross-sectional view of an air isolation barrier, according to certain aspects of the present disclosure.

Referring momentarily now to FIGS. 2A-2B, noise absorbing barriers 200 and a noise isolation barrier 250 are illustrated in accordance with certain embodiments. As an option, the present barriers 200, 250 may be implemented in conjunction with features from any other embodiment listed herein, such as those described with reference to the other FIGS., such as FIGS. 1A-1C. However, such barriers 200, 250 and others presented herein may be used in various applications and/or in permutations which may or may not be specifically described in the illustrative embodiments listed herein. Further, the barriers 200, 250 presented herein may be used in any desired environment. Thus FIGS. 2A-2B (and the other FIGS.) may be deemed to include any possible permutation.

Looking specifically to FIG. 2A, the noise absorbing barriers 200 are illustrated as being positioned on opposite sidewalls (e.g., sides) of a channel 202. Accordingly, the noise absorbing barriers 200 may be applied to all interior surfaces of a given component. For instance, noise absorbing barriers 200 may be applied to all interior surfaces of air inlet and/or outlet channels.

A noise absorbing barrier 200 includes a plate layer 204 coupled to a noise absorbing layer 206. In some implementations, the plate layer 204 may be coupled directly to the noise absorbing layer 206. In other words, there may not be any intermediate layers positioned between the plate layer 204 and the noise absorbing layer 206. Despite not having any intermediate layers therebetween, the plate layer 204 and noise absorbing layer 206 may be directly coupled to each other using one or more adhesives applied to coupled surfaces of the respective layers 204, 206. In other approaches, the plate layer 204 may be coupled to the noise absorbing layer 206 using one or more fasteners, clamps, brackets, magnets, etc.

The plate layer 204 is preferably a perforated plate having a plurality of holes extending therethrough. In other words, the plate layer 204 includes a piece of material (e.g., metal) having different hole sizes, shapes, patterns, etc., that have been formed through the piece of material. For example, the plate layer 204 may include material having evenly spaced holes formed therethrough, the holes having an inner diameter of between about 0.01 millimeters (mm) and about 10 mm, but could be higher or lower. Depending on the approach, these holes may have been formed manually, mechanically (e.g., stamped or punched), using laser cutting, etc. Accordingly, the plate layer 204 is depicted in FIG. 2A as having alternating crosshatching to indicate the various holes that extend through the layer 204.

Depending on the approach, the plate layer 204 may include aluminum, steel, stainless steel, gypsum, etc., or another type of desired material. The noise absorbing layer 206 may also include different materials depending on the implementation. For instance, the noise absorbing layer 206 may include foam, rockwool, glasswool, etc., or any other type of material that is able to absorb sound (e.g., convert sound into heat) and which would be apparent to one skilled in the art after reading the present description.

The noise absorbing layer 206 is further separated from the outer noise isolation layer 210 of the channel 202 by an air layer 208. In some approaches, the air layer 208 is enclosed (e.g., sealed) such that air is trapped in a confined volume between the noise absorbing layer 206 and the outer noise isolation layer 210. The air included in an enclosed air layer may include specific gasses (e.g., molecules), be pressurized, kept at a predetermined temperature, etc. In other approaches, the air layer 208 is not enclosed (e.g., is open), allowing for air to pass therethrough.

While the plate layer 204 in combination with the noise absorbing layer 206 and air layer 208 significantly reduce noise, the noise isolation layer 210 may serve to further prevent any remaining noise from escaping through the sidewalls of the channel 202. Accordingly, the noise isolation layer 210 preferably includes a type or rubber, e.g., such as ethylene propylene diene monomer (EPDM), or any other material that is capable of effectively blocking (e.g., insulating) soundwaves from passing therethrough. The noise isolation layer 210 may also have a thickness of between about 1 mm and about 3 mm, but could be higher or lower depending on the approach.

It should also be noted that while the noise absorbing barrier 200 is illustrated in FIG. 2A as having the above configuration, this is in no way intended to be limiting. For instance, in other implementations, a noise absorbing barrier may include only a noise absorbing layer and a noise isolation layer. In other implementations, a noise absorbing barrier may include a noise isolation layer separated from a patterned plate layer by an air barrier. In still other implementations, a noise absorbing barrier may include a noise isolation layer, separated from a patterned plate layer by a noise absorbing layer. It follows that various combinations of the layers described herein may be combined to create various structures that may be used to coat the surfaces of compute cabinet assemblies as desired.

Looking now to FIG. 2B, the noise isolation barrier 250 includes a noise absorbing layer 252, and a noise isolation layer 254, these layers 252, 254 being sandwiched between outer walls 256. In some implementations, the noise absorbing layer 252 and noise isolation layer 254 may be coupled directly to each other. In other words, there may not be any intermediate layers positioned between the noise absorbing layer 252 and noise isolation layer 254. Despite not having any intermediate layers therebetween, the noise absorbing layer 252 and noise isolation layer 254 may be directly coupled to each other using one or more adhesives applied to coupled surfaces of the respective layers 252, 254. In other approaches, the noise absorbing layer 252 may be coupled to and noise isolation layer 254 using one or more fasteners, clamps, brackets, magnets, etc.

The noise absorbing layer 252 and noise isolation layer 254 may further implement any of the approaches above with respect to layers 206 and 210, respectively. Accordingly, the noise absorbing layer 252 may include foam, rockwool, glasswool, etc., or any other type of material that is able to absorb sound (e.g., convert sound into heat) and which would be apparent to one skilled in the art after reading the present description. The noise isolation layer 254 may include a type or rubber, or any other material that is capable of effectively blocking (e.g., insulating) soundwaves from passing therethrough. Moreover, the outer walls 256 may include any desired type of metal, plastic, etc.

It follows that the barriers depicted in FIGS. 2A-2B are desirably able to reduce the amount of noise that is in a given environment. For instance, applying noise absorbing barriers and/or noise isolation barriers to the surfaces of a compute cabinet assembly (e.g., see 100 of FIG. 1A-1C) significantly reduces the amount of noise that escapes from inside the assembly. These barriers may also be applied to the various surfaces of the assembly differently depending on the implementation. Referring momentarily back to FIGS. 1A-1C, in some implementations the noise absorbing barriers and the noise isolation barriers are applied to at least one surface of the equipment room 102, more preferably at least one interior surface of the equipment room 102, more preferably still all interior surfaces of the equipment room 102.

In other implementations, the noise isolation barriers are applied all interior surfaces of the equipment room 102, while a noise absorbing barrier is applied to one exterior surface of the equipment room 102. In other implementations the noise absorbing barriers and the noise isolation barriers are both applied to at least one surface of the cabinet fan module 106, more preferably at least one interior surface of the cabinet fan module 106, more preferably still all interior surfaces of the cabinet fan module 106. In still other implementations the noise absorbing barriers and the noise isolation barriers are both applied to all interior surfaces of the cabinet fan module 106 and the equipment room 102, while noise absorbing barriers are applied to all interior surfaces of the air inlet channel 104 and air outlet channels 108, 110.

This allows for compute devices like edge servers to be positioned in environments that are sensitive to noise, which has been conventionally unachievable without significantly reducing throughput of the computing device. However, embodiments included herein introduce implementations that are able to maintain desired airflow while also significantly reducing the noise footprint of the resulting system.

It should again be noted that while various portions of the compute cabinet assembly 100 have been depicted and/or described as being coupled to certain surfaces of the equipment room 102, this is in no way intended to be limiting. Rather, the different portions of the assembly may be implemented (e.g., positioned) differently. For instance, the air inlet channel 104 is depicted in the present embodiment as being directly coupled to a "bottom" surface of the equipment room 102 when positioned in an intended orientation. However, this is in no way intended to be limiting. The air outlet channels 108, 110 may be coupled to "top" and "bottom" surfaces of the assembly 100 while positioned in an intended orientation, and the air inlet channel 104 and cabinet fan module 106 positioned on opposite sides of the assembly 100 while in the same orientation.

Figure 3:
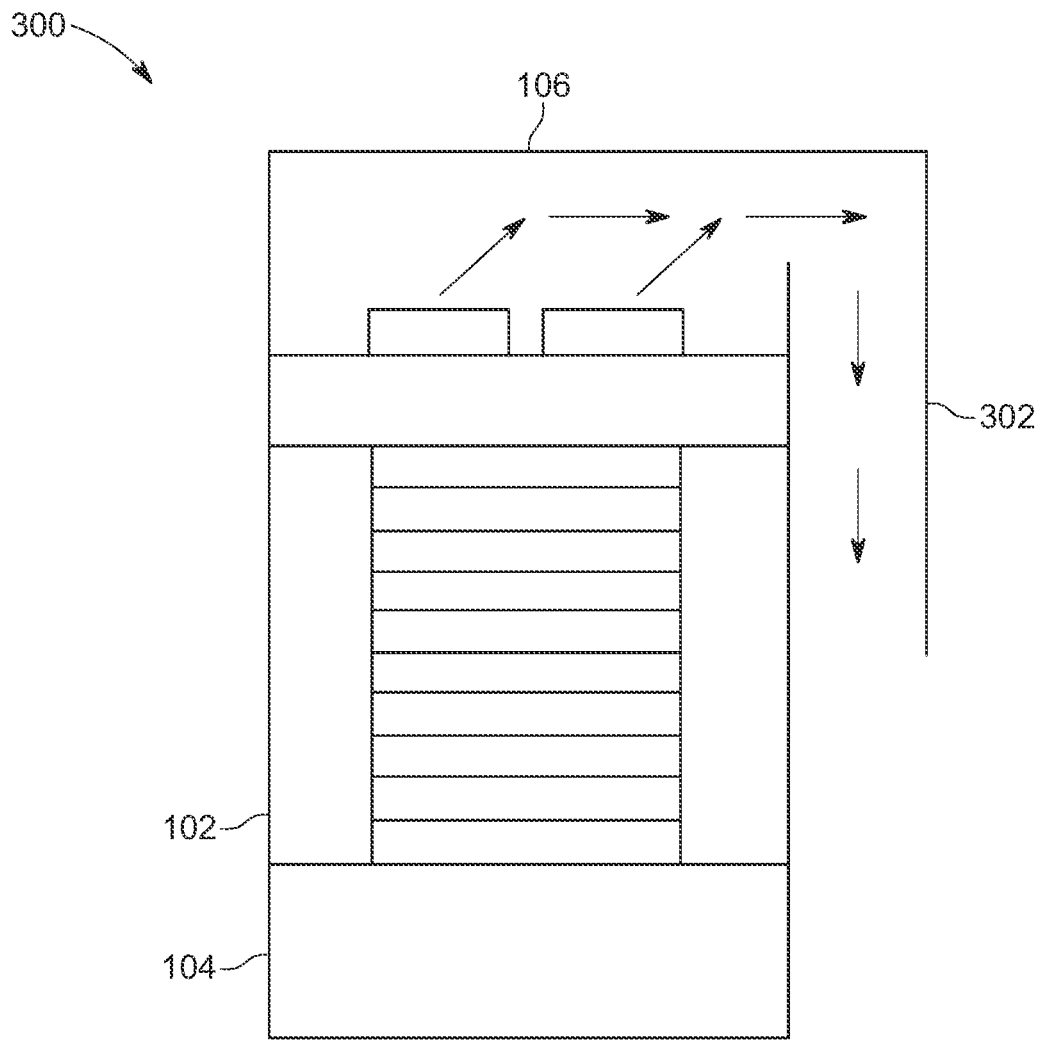
FIG. 3 is a cross-sectional view of a compute cabinet assembly, according to certain aspects of the present disclosure.

Similarly, the number of portions the compute cabinet assembly 100 is shown as including is in no way intended to be limiting. For instance, in some implementations a compute cabinet assembly includes only one air outlet channel. Looking now to FIG. 3, a compute cabinet assembly 300 that provides cooling capacity and noise reduction is illustrated in accordance with one embodiment. Specifically, FIG. 3 illustrates a variation of the embodiment of FIGS. 1A-1C depicting an exemplary configuration of the air outlet channel 302. Accordingly, various components of FIG. 3 have common numbering with those of FIGS. 1A-1C.

As shown, the compute cabinet assembly 300 includes the equipment room 102 which is configured to implement electrical components therein. The air inlet channel 104 is also shown as being coupled to a first side of the equipment room 102. The compute cabinet assembly 300 also includes the cabinet fan module 106 coupled to a second side of the equipment room 102. Specifically, the cabinet fan module 106 is illustrated as being coupled directly to a top of the assembly 100. It follows that the air inlet channel 104 and cabinet fan module 106 are positioned on opposite sides of the compute cabinet assembly 300.

However, only one air outlet channel 302 is illustrated in the present implementation as being coupled to a side of the equipment room 102. This air outlet channel 302 is also positioned such that at least a portion of the cabinet fan module 106 is coupled thereto. For instance, an air outlet of the cabinet fan module 106 may connect directly to an inlet of the air outlet channel 302. The air outlet channel 302 is thereby preferably configured to direct airflow down the side of the equipment room 102 and away from the cabinet fan module 106, e.g., as shown.

As noted above, noise absorbing barriers and/or noise isolation barriers may also be coupled to any desired surfaces of these various portions of the assembly 300. For instance, noise absorbing barriers may be applied to all interior surfaces of the air inlet channel, the air outlet channel, the equipment room, and the cabinet fan module. Moreover, noise absorbing barriers may also be applied to all interior surfaces of the equipment room, and the cabinet fan module.

Figure 4A:
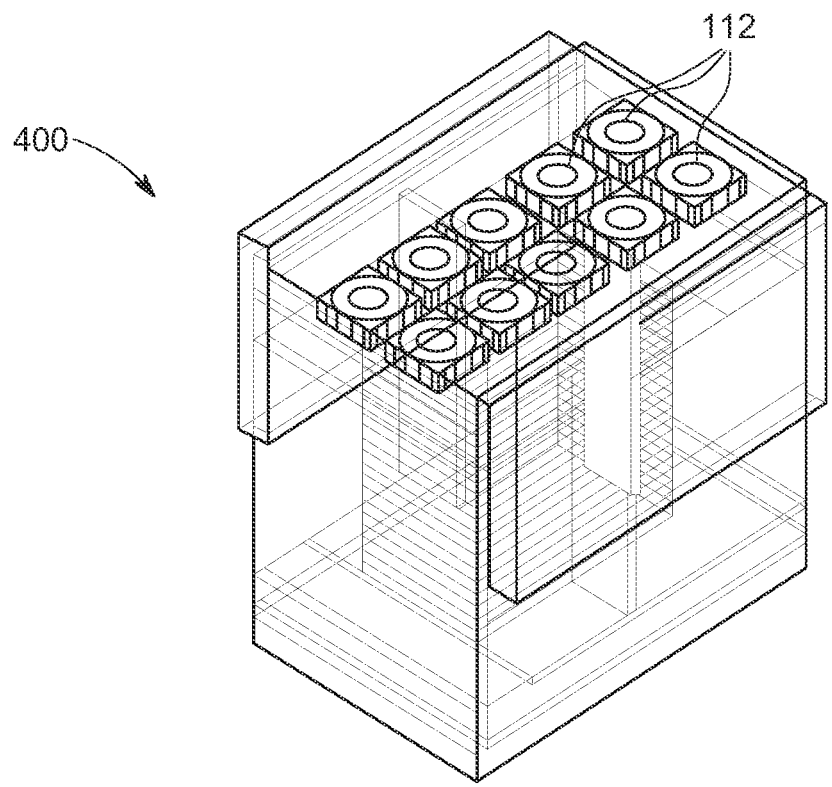
FIG. 4A is a perspective view of a compute cabinet assembly having electric fans positioned in a rectangular configuration, according to certain aspects of the present disclosure.
Figure 4B:
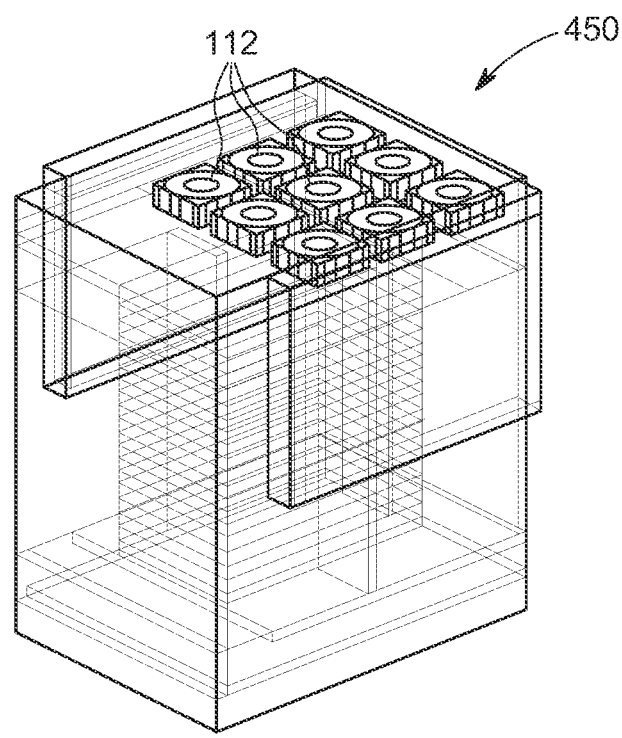
FIG. 4B is a perspective view of a compute cabinet assembly having electric fans positioned in a square configuration, according to certain aspects of the present disclosure.

Referring now to FIGS. 4A-4B, the electric fans are shown in different configurations. As previously mentioned, the cabinet fan module of a given compute cabinet assembly may include a plurality of electric fans (e.g., cabinet fans) therein. These fans may assist in creating an airflow that cools the various electrical components implemented in the assembly. Accordingly, the fans are preferably placed in a configuration that produces desirable airflow(s).

Looking specifically to FIG. 4A, the electric fans 112 are shown in a compute cabinet assembly 400 as being positioned in a rectangular configuration in the cabinet fan module 106. With respect to the present description, a "rectangular configuration" is intended to refer to a situation where each fan is positioned adjacent to each other such that blades in each electric fan rotate coplanar to each other.

While positioning the electric fans 112 in a rectangular configuration produces desirable airflow throughout the assembly 400, the electric fans 112 may again be positioned in different configurations. For instance, FIG. 4B shows the electric fans 112 positioned in the compute cabinet assembly 450 as being positioned in a square configuration. However, any desired configuration (e.g., pattern, shape, design, random organization, etc.) may be implemented.

It follows that various ones of the approaches included herein are able to significantly reduce noise without limiting performance. In other words, the approaches herein are able to reduce the noise profile of compute cabinet assemblies like edge servers such that they may be place in locations having greater noise sensitivity than typical server warehouses. However, this noise reduction does not result in a corresponding reduction in performance typically experienced by conventional implementations. In fact, Inventors have verified with testing, that some of the approaches described herein are able to support over 20 kW of heat dissipation combined with over 25 dBA of noise removal at the same time. Again, this has been conventionally unachievable.

According to some of these approaches, the heat and noise dissipation is achieved at least partially as a result of dividing the compute cabinet assembly into four portions (air inlet channel, air outlet channels, equipment room, and cabinet fan zone). Moreover, by positioning the air inlet channel at the bottom of the assembly, cold air is allowed to enter and absorbs the noise emitting from the components in the assembly. The air outlet channels are located on two sides of the equipment room, thereby allowing hot air to exit and absorb the noise emitting from the components in the assembly. The cabinet fan module includes various electric fans, and is positioned on the top of the equipment room to create sufficient airflow to cool the components in the assembly.

It should be noted that, while various aspects of the implementations herein have been illustrated as including specific designs, orientations, numbers of components, etc., this is in no way intended to limit the invention. Rather, the implementations herein are presented for exemplary purposes only and may vary in design, orientation, number of components, etc., depending on the desired approach. It should also be noted that use of the terms "bottom", "lower", "top", "upper", etc., are in no way intended to be limiting. Any frames of reference used to describe the various implementations herein have been selected for illustrative purposes only and may be adjusted as desired.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A compute cabinet assembly for providing cooling capacity and noise reduction, the compute cabinet assembly comprising:
   an equipment room configured to implement electrical components therein;
   an air inlet channel coupled to a first side of the equipment room;
   a cabinet fan module coupled to a second side of the equipment room opposite the first side;
   a first air outlet channel coupled to the cabinet fan module and extending along a third side of the equipment room towards a first outlet of the first air outlet channel;
   a second air outlet channel coupled to the cabinet fan module and extending along a fourth side of the equipment room towards a second outlet of the second air outlet channel;
   electric fans positioned in the cabinet fan module, the electric fans being configured to create an airflow path originating at an inlet of the air inlet channel, the airflow path extending through the equipment room and cabinet fan module, and the airflow path exiting the compute;
   one or more of noise absorbing barriers or noise isolation barriers coupled to surfaces of the compute cabinet assembly, wherein each of the noise absorbing barriers includes:
      a plate,
      a noise absorbing layer coupled to the plate, and a noise isolation layer, wherein the noise isolation layer is coupled to the surfaces of the compute cabinet assembly;

wherein an air layer separates the noise absorbing layer from the noise isolation layer.

2. The compute cabinet assembly of claim 1, wherein inlets of the first and second air outlet channels are coupled to respective fan outlets of the cabinet fan module, the inlets and the fan outlets configuring the airflow path such that airflow is directed from the first and second air outlet channels to the respective third and fourth sides of the equipment room and away from the cabinet fan module.

3. The compute cabinet assembly of claim 1, wherein the third and fourth sides of the equipment room are on opposite sides of the equipment room.

4. The compute cabinet assembly of claim 1, wherein the plate is a perforated plate having a plurality of holes extending therethrough.

5. The compute cabinet assembly of claim 1, wherein the noise absorbing barriers are in direct contact with surfaces of the air inlet channel.

6. The compute cabinet assembly of claim 1, wherein the noise absorbing barriers are in direct contact with surfaces of the first and second air outlet channels.

7. The compute cabinet assembly of claim 1,
wherein the noise absorbing layer includes a material selected from the group consisting of foam, rockwool, and glasswool; and
wherein the noise isolation layer includes rubber.

8. The compute cabinet assembly of claim 1, wherein each of the noise isolation barriers includes:
a noise absorbing layer, and
a noise isolation layer coupled to the noise isolation layer.

9. The compute cabinet assembly of claim 8, the noise absorbing and noise isolation layers being sandwiched between outer walls of the respective noise absorbing barrier.

10. The compute cabinet assembly of claim 8, wherein the noise absorbing layer includes a material selected from the group consisting of: foam, rockwool, and glasswool, wherein the noise isolation layer includes rubber.

11. The compute cabinet assembly of claim 8, wherein the noise absorbing barriers and the noise isolation barriers are applied to one or more surfaces of (i) the equipment room, or (ii) the cabinet fan module.

12. The compute cabinet assembly of claim 1, wherein the electric fans are oriented in a rectangular configuration in the cabinet fan module.

13. The compute cabinet assembly of claim 1, wherein the equipment room is configured to receive a plurality of edge servers or high performance computing servers therein.

14. A method for providing cooling capacity and noise reduction to a compute cabinet assembly, the method comprising:
causing one or more electric fans in a cabinet fan module coupled to a first side of an equipment room in the compute cabinet assembly to create an airflow path that:
(i) originates at an inlet of an air inlet channel coupled to a second side of the equipment room opposite the first side,
(ii) extends through the equipment room and the cabinet fan module, and
(iii) exits the compute cabinet assembly at first and second outlets of first and second respective air outlet channels, the first and second air outlet channels being coupled to the cabinet fan module and extending along third and fourth respective sides of the equipment room;
wherein one or more noise absorbing barriers or noise isolation barriers are coupled to interior surfaces of the compute cabinet assembly, wherein each of the noise absorbing barriers includes:
a perforated plate having a plurality of holes extending therethrough,
a noise absorbing layer coupled to the plate,
a noise isolation layer, and
an air layer separating the noise absorbing layer and the noise isolation layer; and
wherein the noise isolation layer is coupled to the surfaces of the compute cabinet assembly.

15. The method of claim 14, wherein each of the noise isolation barriers includes:
a noise absorbing layer,
a noise isolation layer coupled to the noise isolation layer, and
outer walls sandwiching the noise absorbing layer and the noise isolation layer therebetween.

* * * * *